(12) United States Patent
Labrot et al.

(10) Patent No.: US 10,471,897 B2
(45) Date of Patent: Nov. 12, 2019

(54) LAMINATED VEHICLE GLAZING WITH AMOLED SCREEN

(71) Applicant: SAINT-GOBAIN GLASS FRANCE, Courbevoie (FR)

(72) Inventors: Michael Labrot, Aachen (DE); Volkmar Offermann, Eschweiler (DE); Bernhard Reul, Herzogenrath (DE)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 0 days.

(21) Appl. No.: 16/067,430

(22) PCT Filed: Dec. 22, 2016

(86) PCT No.: PCT/FR2016/053643
§ 371 (c)(1),
(2) Date: Jun. 29, 2018

(87) PCT Pub. No.: WO2017/115043
PCT Pub. Date: Jul. 6, 2017

(65) Prior Publication Data
US 2019/0001888 A1    Jan. 3, 2019

(30) Foreign Application Priority Data

Dec. 31, 2015 (FR) .................................. 15 63487

(51) Int. Cl.
*B32B 17/10* (2006.01)
*B60R 1/00* (2006.01)
(Continued)

(52) U.S. Cl.
CPC .......... *B60R 1/00* (2013.01); *B32B 17/10036* (2013.01); *B32B 17/10541* (2013.01);
(Continued)

(58) Field of Classification Search
CPC ............ H01L 31/0488; H01L 27/3276; H01L 51/5253; G09G 2380/10; G09G 3/3208;
(Continued)

(56) References Cited

U.S. PATENT DOCUMENTS

2010/0179725 A1   7/2010   Boote et al.
2014/0230899 A1   8/2014   Petrova-Koch et al.

FOREIGN PATENT DOCUMENTS

CN         202503691 U    10/2012
DE    10 2008 004049 A1    7/2009
(Continued)

OTHER PUBLICATIONS

International Preliminary Report on Patentability and the Written Opinion of the International Searching Authority as issued in International Patent Application No. PCT/FR2016/053643, dated Jul. 3, 2018.
(Continued)

*Primary Examiner* — Sanjiv D. Patel
(74) *Attorney, Agent, or Firm* — Pillsbury Winthrop Shaw Pittman LLP

(57) ABSTRACT

A laminated vehicle glazing includes within the laminate an AMOLED screen and an electrical connection element of the AMOLED screen connected to an interface housing on the face F4 and containing one or more electronic components notably for controlling the AMOLED screen, the interface housing also being connected to a wired power supply system.

12 Claims, 11 Drawing Sheets

Figure 7:
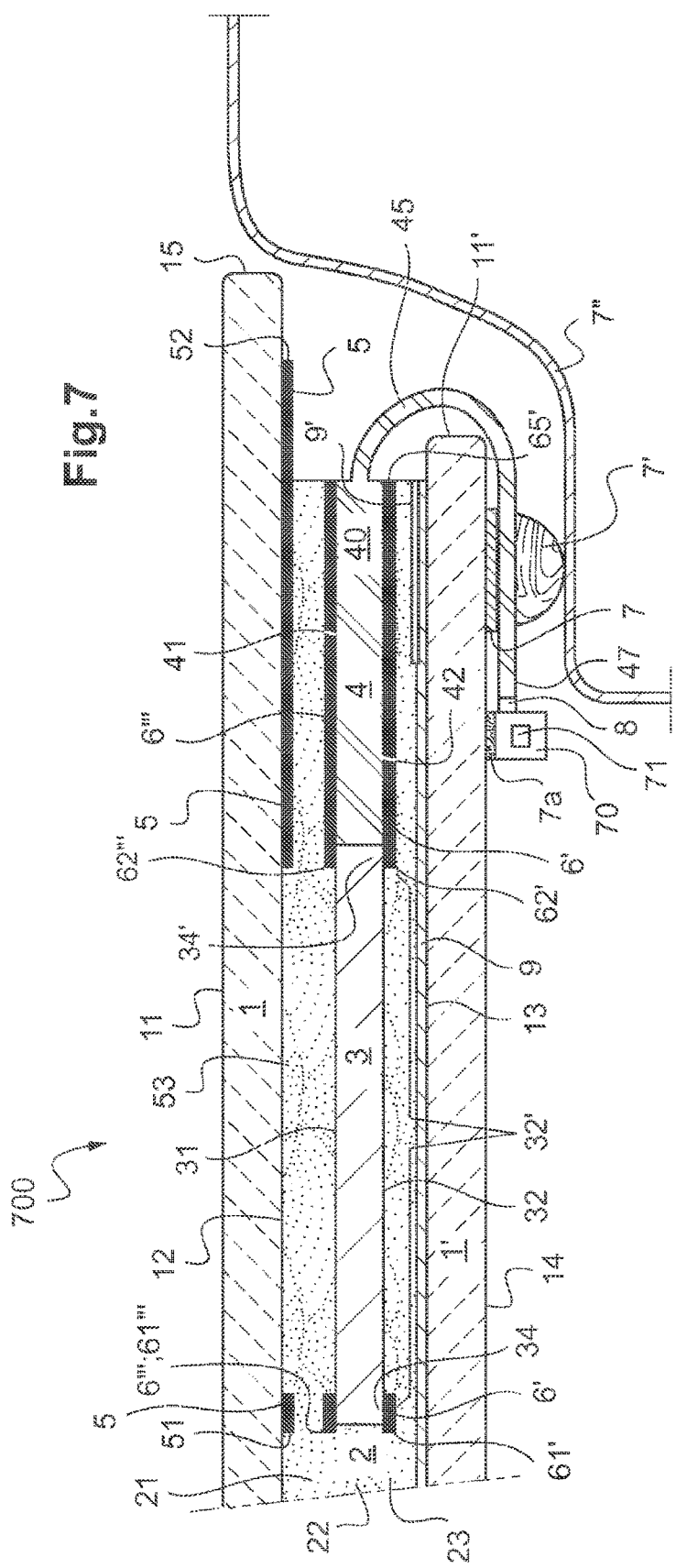

(51) Int. Cl.
*B60K 35/00* (2006.01)
*G02B 27/01* (2006.01)
*H01R 12/62* (2011.01)
*B60J 1/20* (2006.01)
*G09G 3/20* (2006.01)
*G09G 3/3208* (2016.01)
*H01L 27/32* (2006.01)
*H01L 51/00* (2006.01)
*H01L 51/52* (2006.01)

(52) U.S. Cl.
CPC .......... *B32B 17/10761* (2013.01); *B60J 1/20* (2013.01); *B60K 35/00* (2013.01); *G02B 27/01* (2013.01); *G09G 3/2096* (2013.01); *G09G 3/3208* (2013.01); *H01L 27/3276* (2013.01); *H01L 51/0097* (2013.01); *H01L 51/524* (2013.01); *H01R 12/62* (2013.01); *B32B 2605/006* (2013.01); *B60K 2370/152* (2019.05); *B60K 2370/176* (2019.05); *B60K 2370/21* (2019.05); *B60K 2370/785* (2019.05); *B60K 2370/816* (2019.05); *B60R 2300/8046* (2013.01); *G02B 2027/0194* (2013.01); *G09G 2370/16* (2013.01); *G09G 2380/02* (2013.01); *G09G 2380/10* (2013.01); *H01L 2251/5338* (2013.01)

(58) Field of Classification Search
CPC .......... B32B 17/10036; B32B 2605/00; B32B 17/10174; B32B 17/10339; B60R 1/00; B60R 2300/205; B60K 2370/332; G02B 5/305
See application file for complete search history.

(56) References Cited

FOREIGN PATENT DOCUMENTS

| | | |
|---|---|---|
| EP | 2 955 064 A1 | 12/2015 |
| EP | 3 047 989 A1 | 7/2016 |
| FR | 2 933 505 A1 | 1/2010 |
| FR | 3 002 677 A1 | 8/2014 |
| WO | WO 2004/025334 A2 | 3/2004 |
| WO | WO 2010/136702 A1 | 12/2010 |
| WO | WO 2015/041106 A1 | 3/2015 |

OTHER PUBLICATIONS

First Office Action as issued in Chinese Patent Application No. 201680004767.9, dated Sep. 26, 2018.
International Search Report as issued in International Patent Application No. PCT/FR2016/053643, dated Apr. 4, 2017.

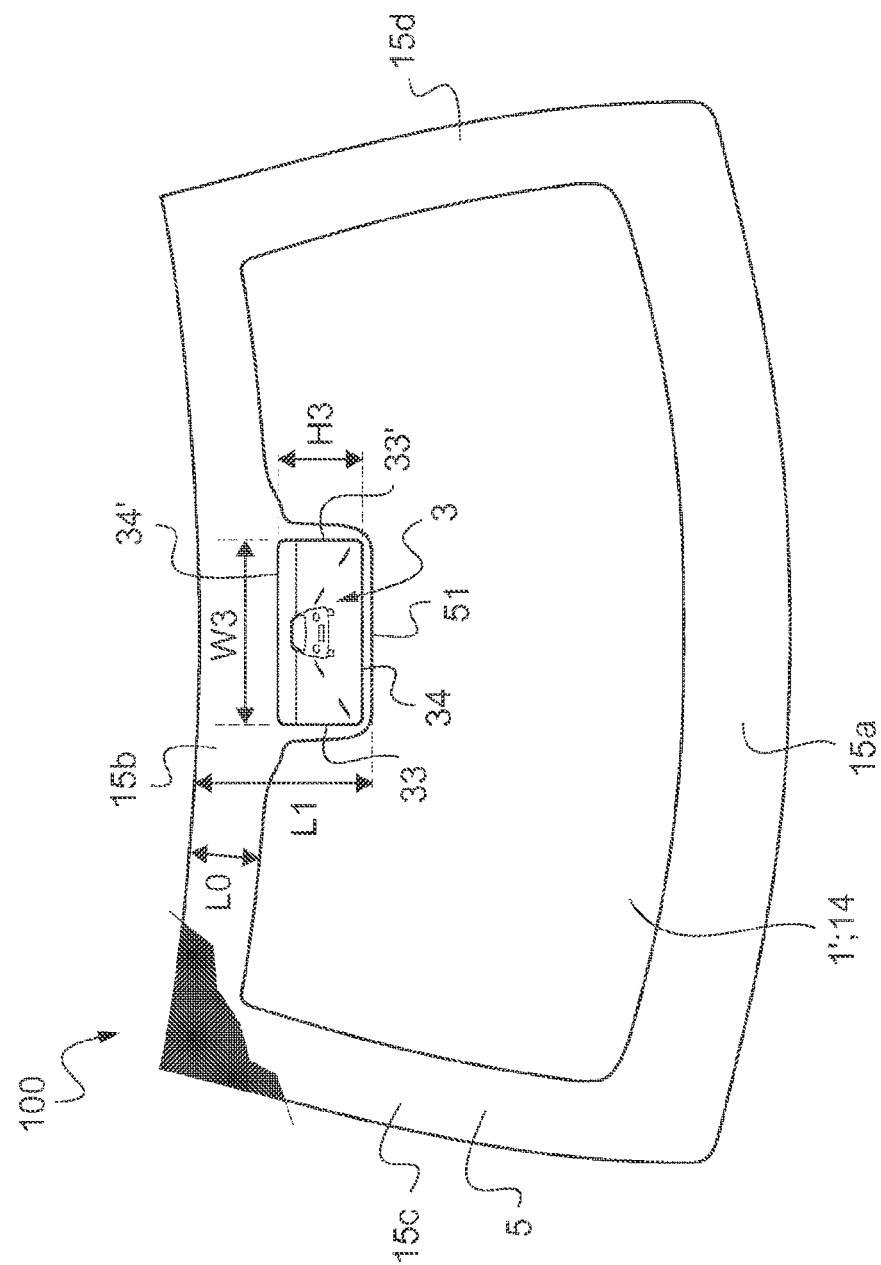

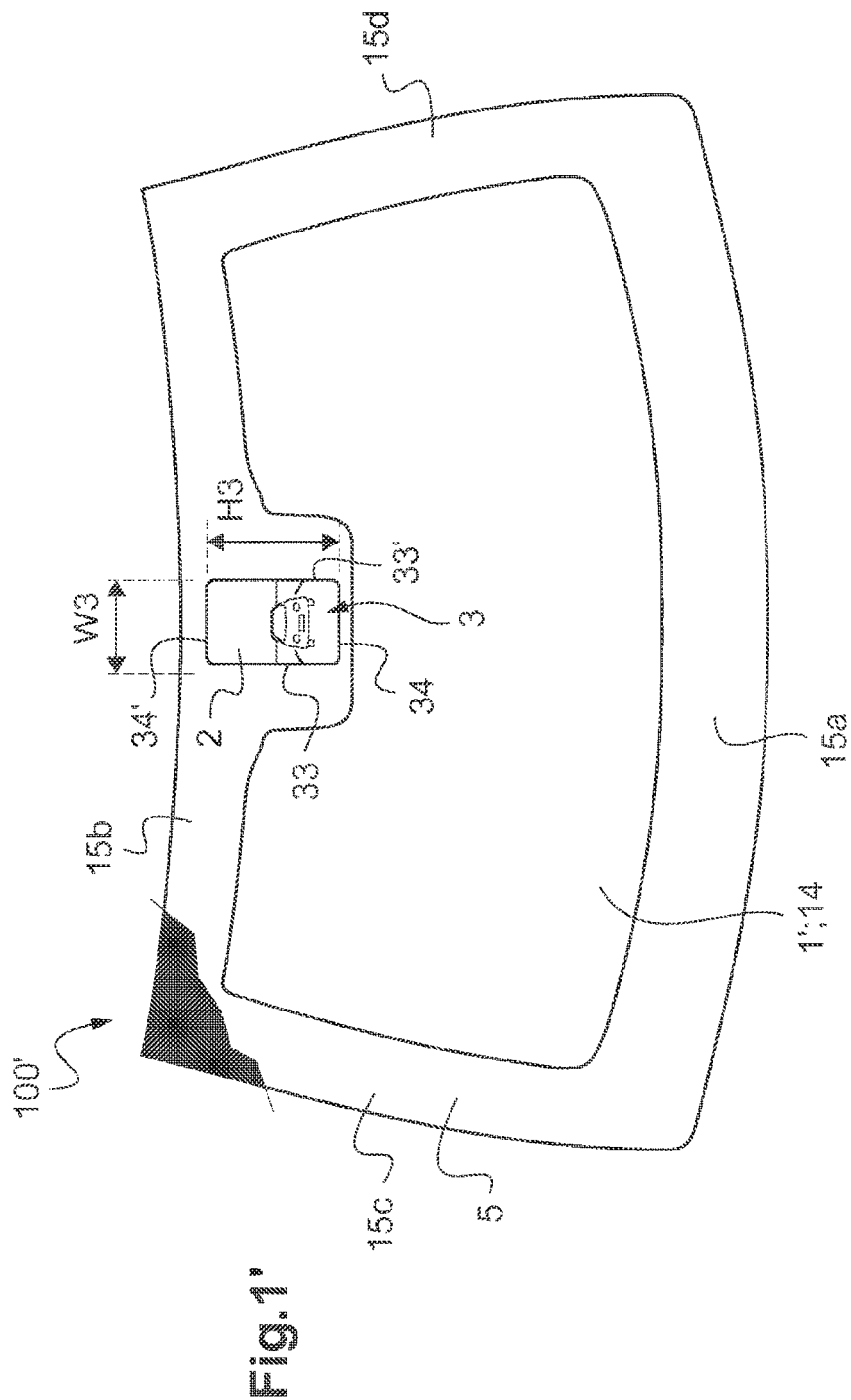

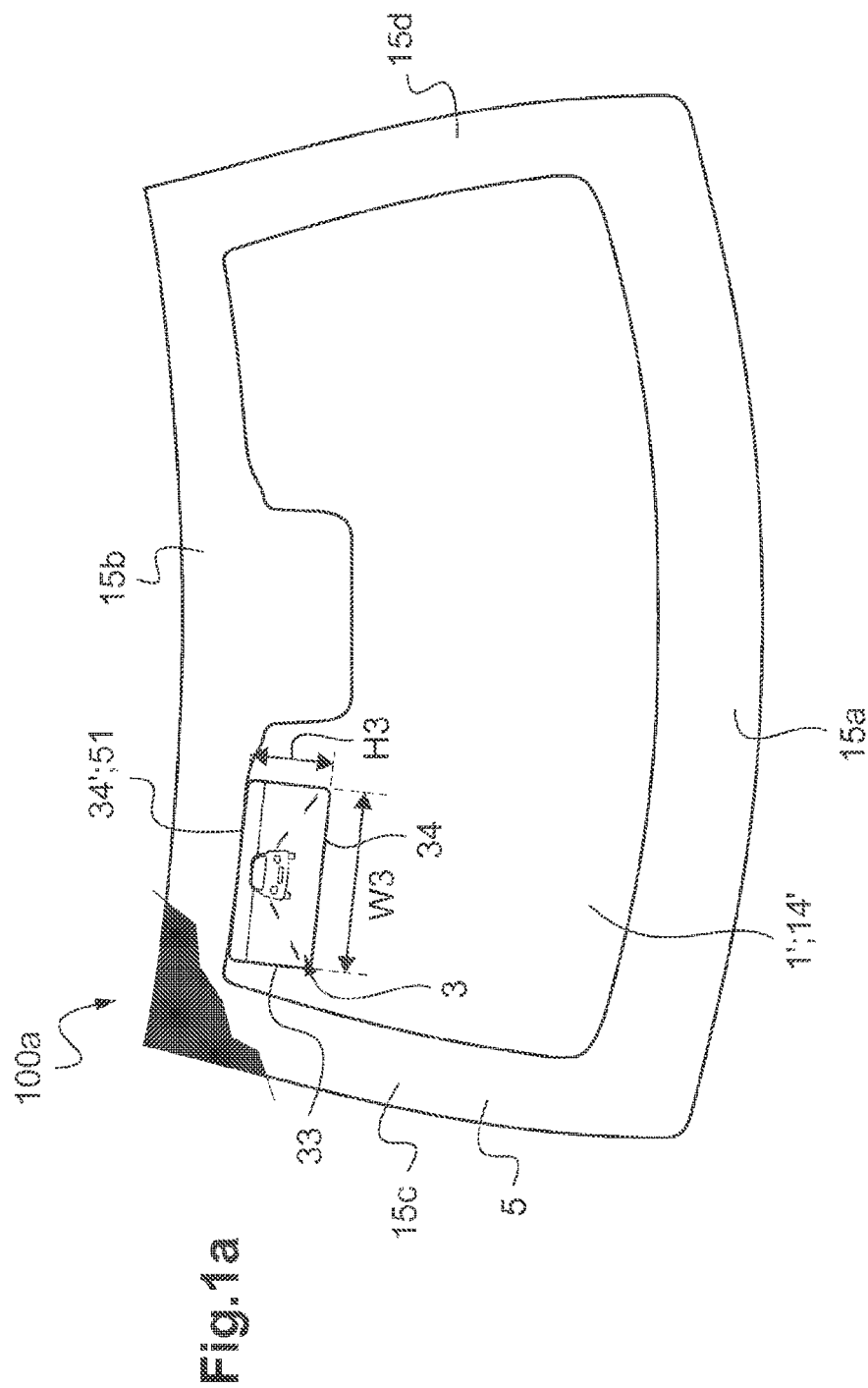

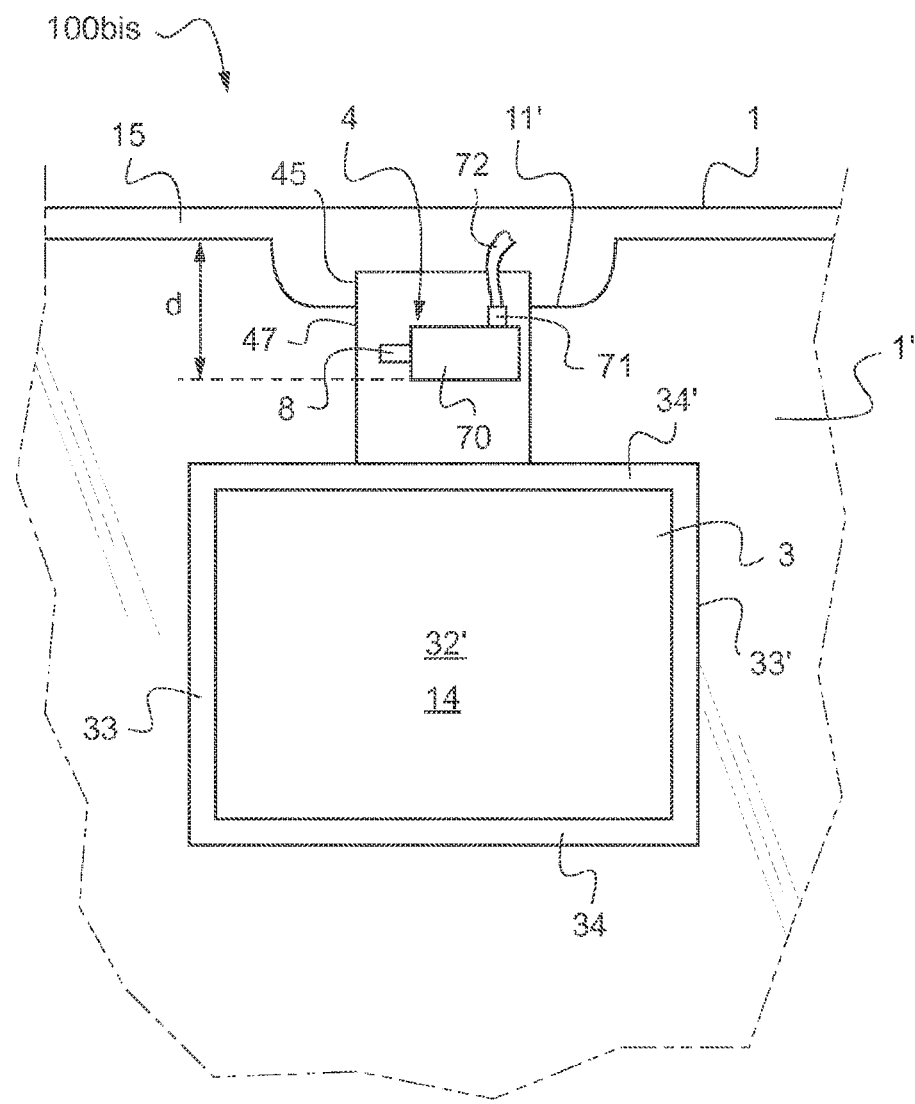
Fig.1bis

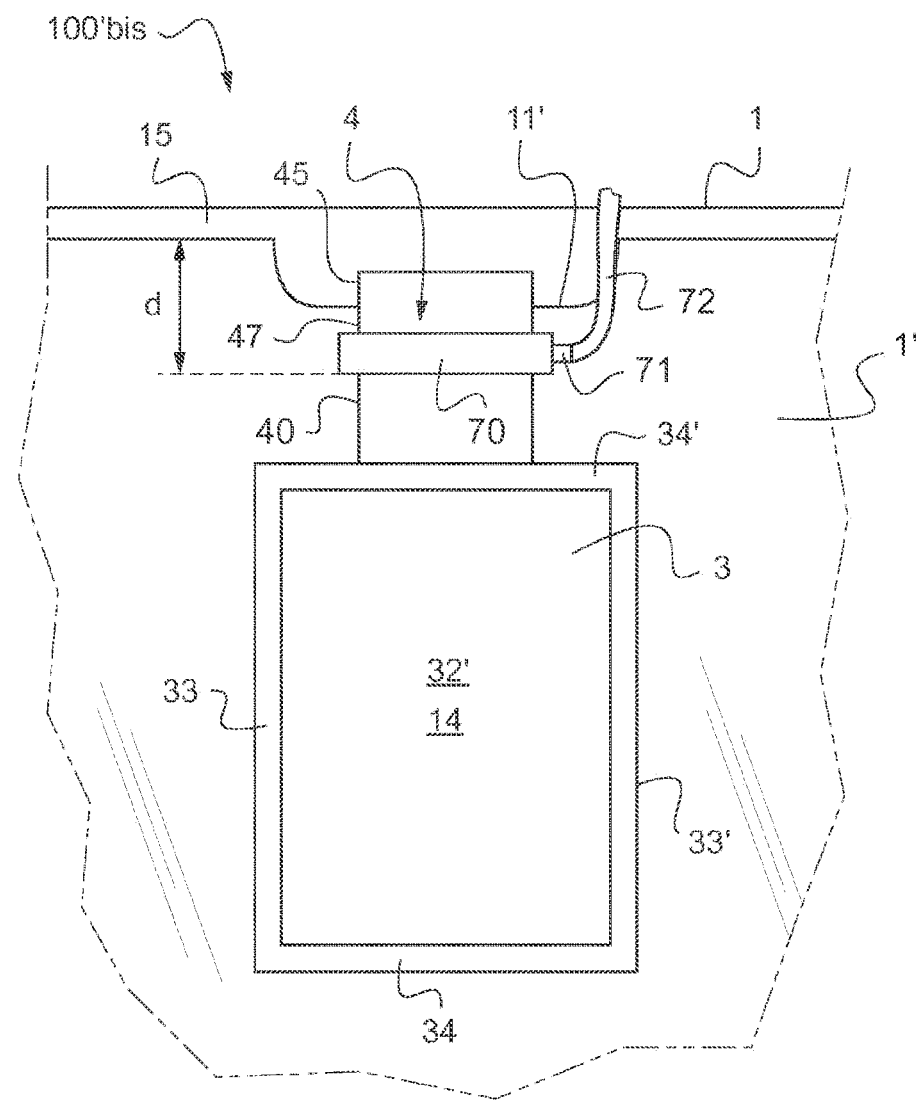
Fig.1'bis

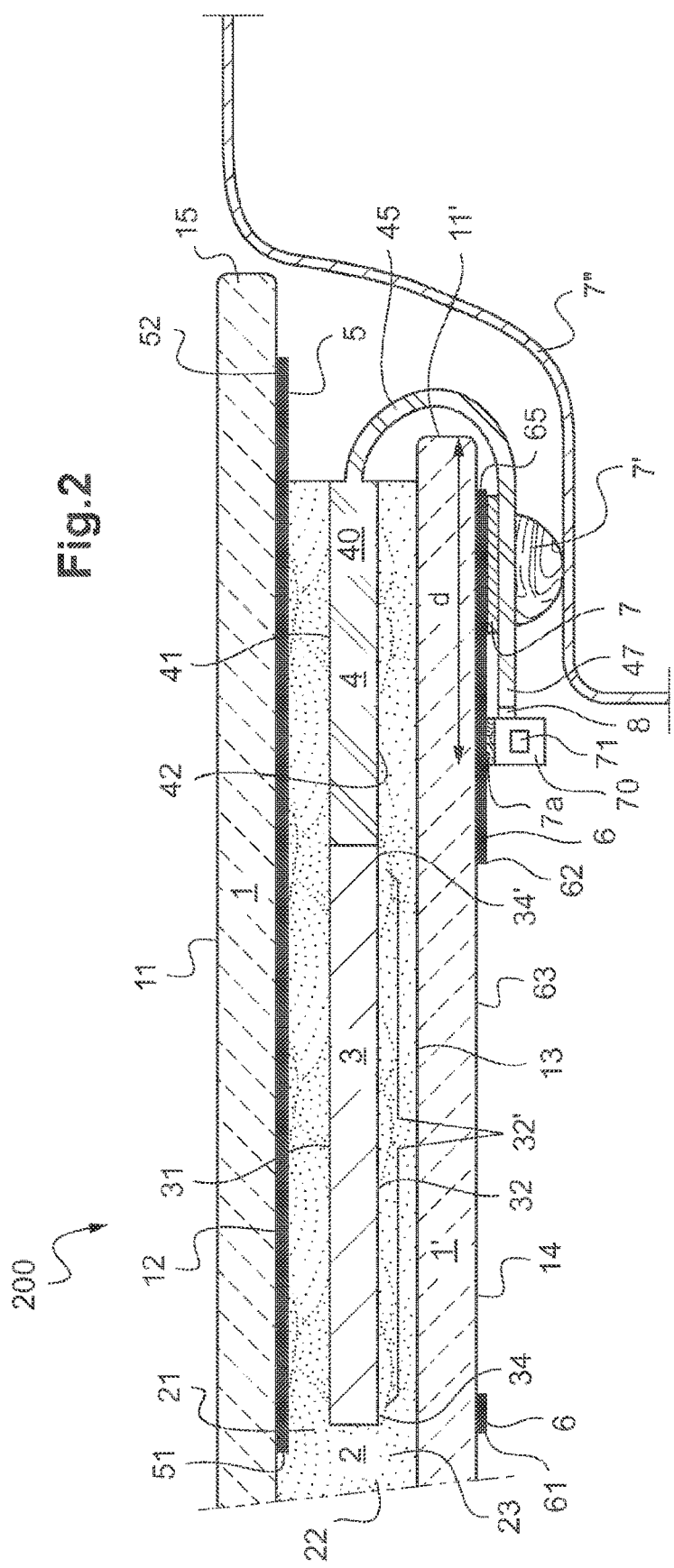

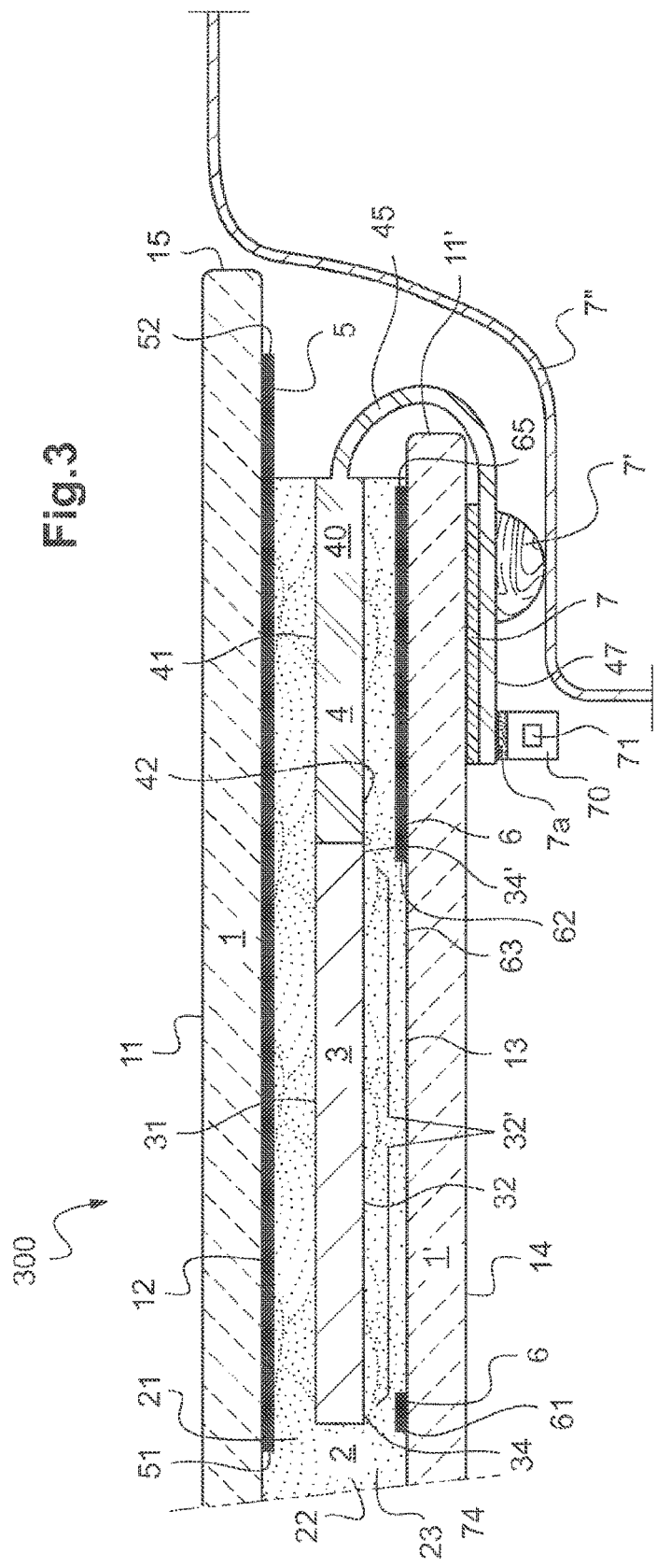

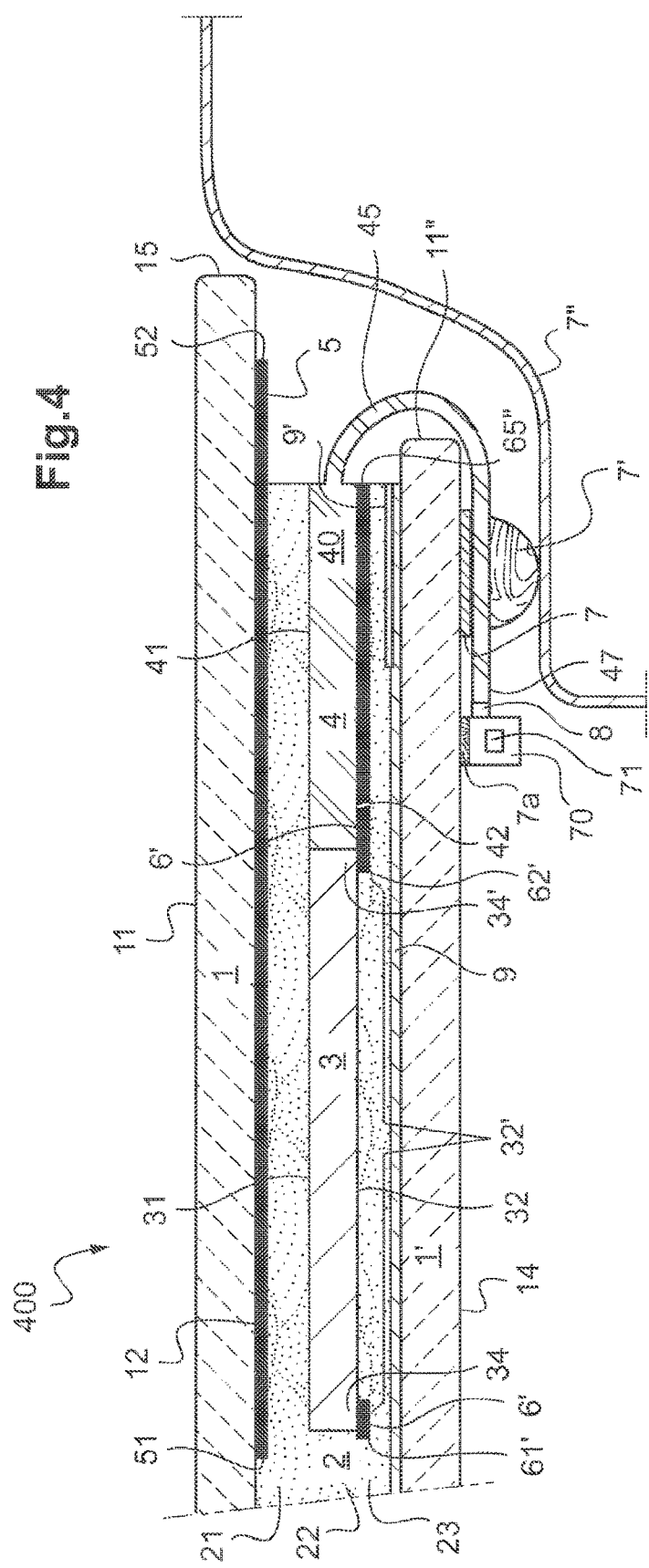

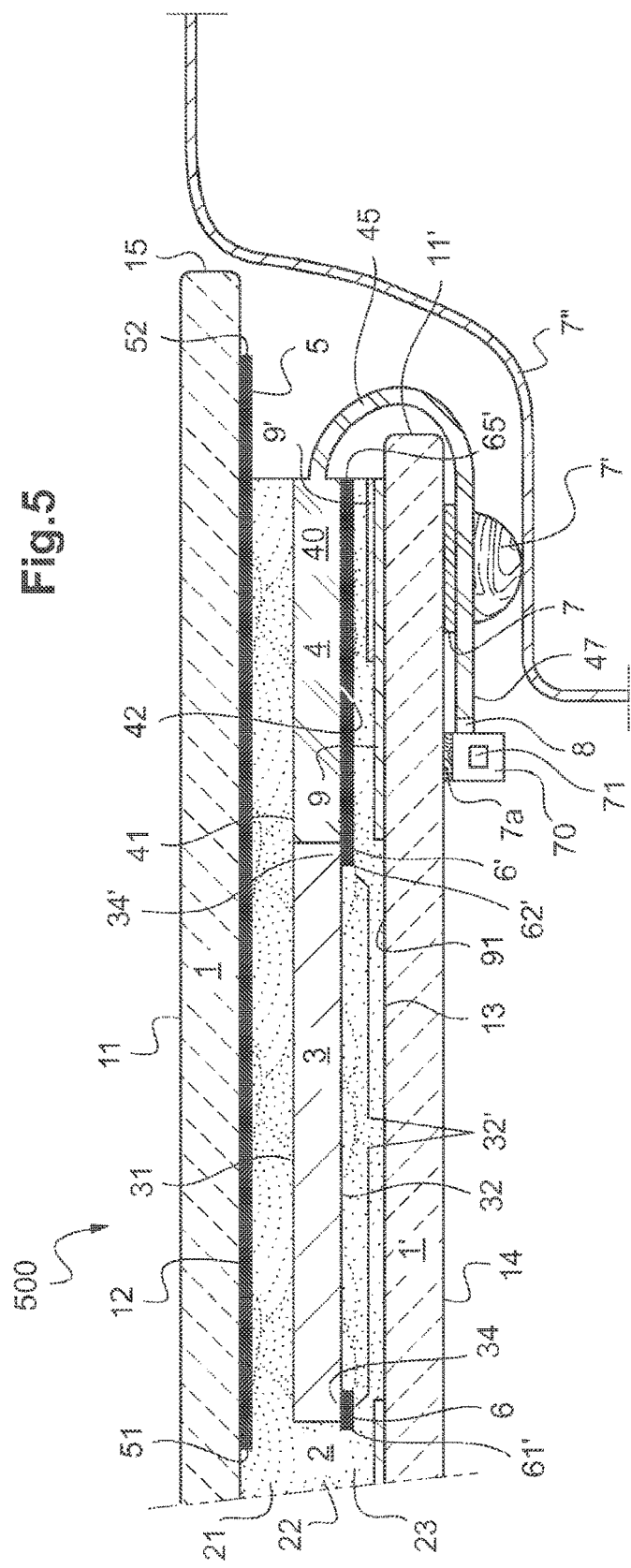

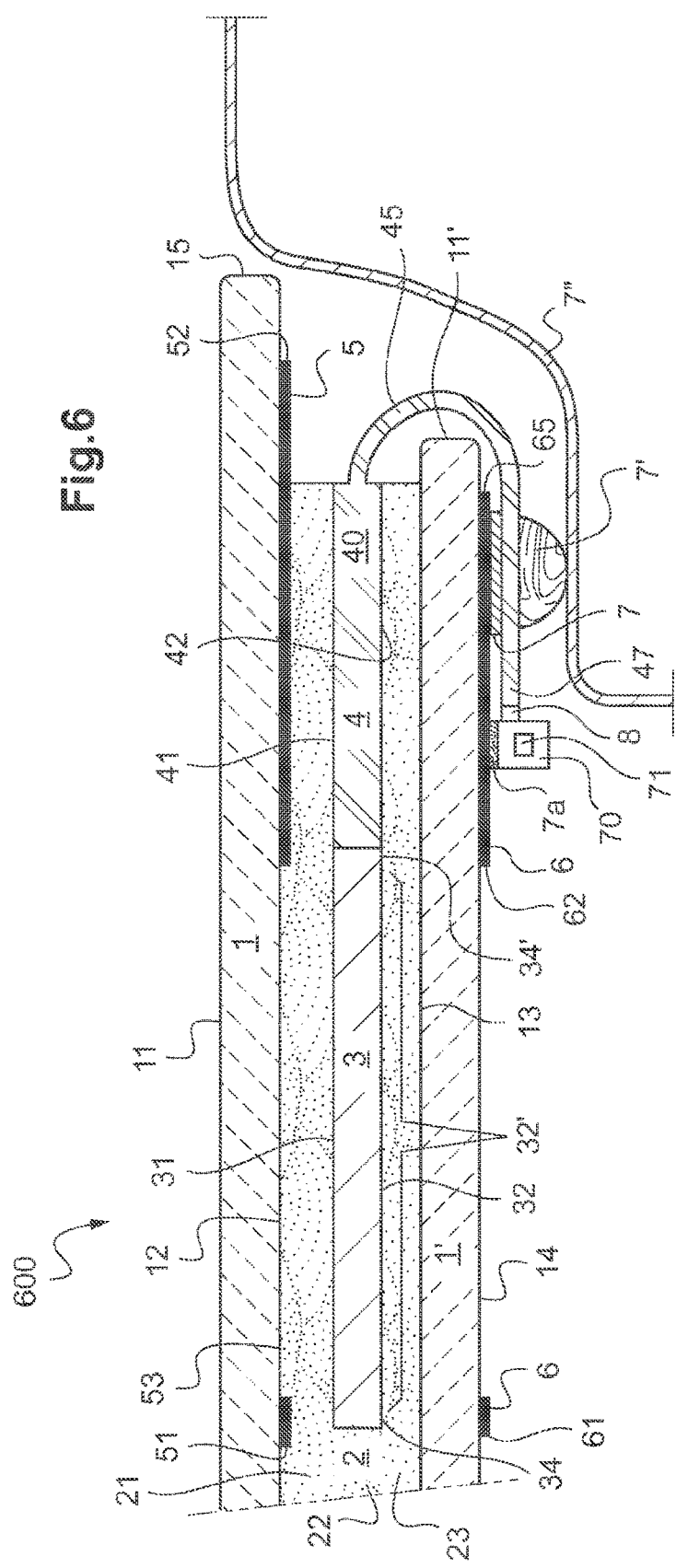

LAMINATED VEHICLE GLAZING WITH AMOLED SCREEN

CROSS-REFERENCE TO RELATED APPLICATIONS

This application is the U.S. National Stage of PCT/FR2016/053643, filed Dec. 22, 2016, which in turn claims priority to French patent application number 1563487 filed Dec. 31, 2015. The content of these applications are incorporated herein by reference in their entireties.

The invention relates to a laminated vehicle glazing and more particularly a laminated vehicle glazing integrating an AMOLED screen.

An ever greater number of intelligent windshields exist which deliver information to the driver.

Document WO2015041106 proposes in particular an automobile windshield comprising an AMOLED (Active Matrix Organic Light Emitting Diode) screen—between the internal faces of the two glazings, screen arranged peripherally and masked in the enameled boundary on face F2 that is to say the internal face of the outermost glazing. The horizontally positioned AMOLED screen is aimed at replacing the internal rear view mirror to see the rear of the vehicle—conventionally in the form of a mirror—and is preferentially situated in the central part along the top longitudinal edge of the windshield. It is coupled with a camera at the rear of the vehicle.

The aim of the invention is to improve this laminated vehicle glazing with AMOLED screen notably windshield with AMOLED screen.

For this purpose, the subject of the present invention is a laminated vehicle glazing notably windshield or lateral glazing of a vehicle notably a road vehicle, comprising:
- a first glazing, preferably cambered, preferably of mineral glass, preferably tinted, notably gray or green, with a first main face termed F1 intended to be on the outside of the vehicle and a second opposite main face termed F2, glazing of thickness E1 preferably (especially in the road sector, for an automobile) of at most 2.5 mm, even of at most 2 mm—notably 1.9 mm, 1.8 mm, 1.6 mm and 1.4 mm—or even of at most 1.3 mm or of at most 1 mm.
- a lamination interlayer of polymeric substance (clear, extraclear), preferably thermoplastic, on the face F2 side, of (total) thickness E2 preferably especially in the road sector, for an automobile) of at most 2.2 mm better of at most 2 mm, of at most 1.5 mm or even of at most 0.76 mm, for example composed of several plies for example 3 plies, notably set back from the lip of the second glazing (by at most 5 mm or even by at most 2 mm or by at most 1 mm)
- a second glazing, preferably cambered (like the first glazing), preferably of mineral glass, with a third main face termed F3 on the lamination interlayer side and a fourth opposite main face termed F4, notably intended to be on the inside of the vehicle, optionally tinted (or clear and even with an electroconducting layer on face F3 or even F4), of thickness E'1 preferably less than E1, even of at most 2.2 mm (especially in the road sector, for an automobile)—notably 1.9 mm, 1.8 mm, 1.6 mm and 1.4 mm—or even of at most 1.3 mm or of at most 1 mm, the total thickness of the glazings E1+E'1 being preferably (especially in the road sector, for an automobile) strictly less than 4.4 mm, even than 3.7 mm, one at least—and better both—of the first and second glazings being made of glass, the other optionally of organic, polymeric substance such as a polycarbonate,
  between the face F2 and the face F3, a first organic light-emitting diode-based viewing screen termed a flexible AMOLED screen 3, comprising a set of pixels, the first AMOLED screen comprising a (central) zone of dynamic information display,—the AMOLED screen comprising a first flexible support (glass polymeric substance, or indeed even metal) bearing organic light-emitting system(s) between two electrodes—and AMOLED screen of thickness E3 less than E2 preferably subcentimetric and even of at most 0.5 mm, AMOLED screen having a front main face oriented toward F3 and a rear main face oriented toward F2,—the AMOLED screen being covered by a non-zero thickness of lamination interlayer—and preferably within the lamination interlayer—therefore with a non-zero thickness E21 of lamination interlayer between the rear face and F2 and/or with a non-zero thickness E22 between the front face and F3, E2 corresponding to the thickness on the side of the AMOLED screen (notably E2>than E21+E22 and substantially equal to E3), the AMOLED screen is notably arranged peripherally,
- an electrical connection element 4 of the AMOLED screen with a so-called terminal part against or fixed (by gluing such as a notably pressure-sensitive double-sided adhesive) on face F4 (without stretching as far as the display zone, and even leaving room for an interface housing), preferably with a so-called connecting part between the face F2 and the face F3, of thickness E4 less than E2 and preferably subcentimetric, with a front surface on the face F3 side and a rear surface on the face F2 side, connecting part covered by a non-zero thickness of lamination interlayer and even preferably connecting part within the lamination interlayer (like the AMOLED screen) with a non-zero thickness E41 of lamination interlayer between the rear surface and the face F2 and with a non-zero thickness E42 (preferably identical to the thickness E3) between the front surface and the face F3).

The connecting part is linked (preferably permanent link) to the AMOLED screen and extends (directly) the AMOLED screen in the direction of the lip of the second glazing, and the flexible electrical connection element extending outside of the lip of the second glazing via an exterior part (of thickness E'4 less than E4 beyond the lip of the second glazing), which is curved (flexible) and said so-called terminal part.

The connection element in particular is for the power supply and (preferably)/or transporting data signals (simultaneously or sequentially) in particular electrical connection element comprising one or more power supply tracks (or "supply lines") and/or one or more tracks for the data signals (or "data lines"), and electronic components (optionally in particular in the connecting part).

The glazing according to the invention comprises, on the face F4, an interface housing connected (by a male-female connection system by plugging in, by clipping, by snap-fastening or any preferably removable link) to the terminal part of the electrical connection element (glued by adhesive.), enclosing one or more electronic components (on a printed circuit board of PCB type for example), preferably for control) of the AMOLED screen (and/or for exchanging data with the AMOLED screen), the interface housing furthermore being connected (at least) with a wired (wire or cable etc) power supply system, notably by a male-female connection system by plugging in, by clipping, by snap-fastening or any removable link preferably, notably outside the glazing and stretching outside the face F4 of the glazing (along the lip).

The glazing according to the invention comprises, on the face F4, an interface housing connected to the terminal part of the electrical connection element and enclosing one or more electronic components notably for control of the AMOLED screen, the interface housing being (optionally solely) furthermore connected with a wired power supply system notably on one and the same edge or on a distinct edge of the interface housing.

The interface housing makes it possible to manage fewer wires or cables to facilitate mounting dismantling and the exchanging of data between AMOLED screen and a local network, a telephone, a computer. It can make it possible to separate connection technology and electronic interface for control of the AMOLED screen.

The wired power supply system does not therefore directly supply preferably on the terminal part.

The housing can be moisture-tight

According to one embodiment, the interface housing can furthermore be connected to a wired system (cable etc,) for transporting data signals (to a "busdriver"), for the AMOLED screen, notably by a male-female connection system, by plugging in, by clipping, by snap-fastening or any removable link preferably, notably outside the glazing and stretching outside the face F4 of the glazing (along the lip). The wired system for transporting data signals for the AMOLED screen can be on one and the same edge of the interface housing or on a distinct edge as for the wired power supply system.

The housing can be parallelepipedal and/or:
with a longitudinal edge oriented toward the lip of the second glazing connected to said connector of the wired power supply system
with a lateral edge connected to said connector of the terminal part
and even with another lateral edge connected to said connector of the wired system for the data.

The housing can be parallelepipedal and/or with a longitudinal edge oriented toward the lip of the second glazing connected to said connector of the wired power supply system and connected to said connector of the terminal part or indeed even connected to said connector of the wired system for the data.

The housing can be parallelepipedal and/or:
with a longitudinal edge oriented toward the lip of the second glazing optionally connected to said connector of the wired data system
with a lateral edge connected to said connector of the terminal part
with another lateral edge connected to said connector of the wired power supply system.

According to one embodiment, the interface housing comprises a back which carries or is a printed circuit board.

The interface housing can furthermore be connected to a wired system for transporting data signals for the AMOLED screen which stretches outside the glazing (preferably peripherally (and under a trim, mounting made of plastic etc).

The housing can comprise a receiver of antenna signals. The antenna signals (radiofrequency, microwave frequency, HF, UHF) are for example for remote-toll-payment or arise from a local communication network such as BLUETOOTH, WIFI, WLAN transporting data for the AMOLED screen, notably for its control.

The housing can be mounted on the terminal part or is adjacent to the terminal part and connected to an end of the terminal part and against or fixed (by gluing such as a double-sided adhesive, sensitive to pressure) to said face F4.

The back of the housing can correspond to a zone of the surface of the terminal part.

The interface housing is made of plastic notably with means of extra and/or metallic electromagnetic shielding with a communication window for signals reception.

The interface housing is preferably masked, notably behind a trim of the vehicle, at a distance d from the lip of the second glazing of at most a few cm, for example less than 5 cm.

The invention applies equally well when:
the AMOLED screen is in the clear window region and the connecting part is peripheral (notably opaque or slightly transparent) or absent (the connection element absent from the laminate, possibly being "wireless")
the AMOLED screen and the connecting part are peripheral (notably opaque or slightly transparent).

The AMOLED screen (like the optional connection element) is preferably within lamination for better mechanical resilience. Thus, the lamination interlayer is then present at the front and at the rear of the AMOLED screen (like the optional connection element) this being advantageous with respect to a dissymmetric solution in which the AMOLED screen (like the optional connection element) is added (against or fixed by double-sided adhesive or glue or contact by adhesion) to the face F2 or the face F3.

For road vehicle windshields in particular, the glazings are preferably cambered and even in two directions, and preferably with two mineral glass glazings and even with a PVB lamination interlayer. In this case, the flexible AMOLED screen adapts to the curvatures like the optional connecting part (and the first sensor on flexible film).

Preferably the laminated glazing forms a windshield of a road vehicle such as an automobile, a truck, with the first and second mineral glass glazings cambered and even a PVB lamination interlayer and an AMOLED screen within the lamination (just like the connecting part).

The connection element can be "wireless". A flexible (flat) connector according to the invention is however preferred for the transport of the power signals and/or data signals to one or more induction-based or capacitive etc. wireless connectors. The electrical connection element preferably of submicronic thickness E4 substantially equal to E2 and of thickness E'4 less than E4 beyond the lip of the second glazing, is preferably curved and against or better fixed by gluing on face F4 without stretching as far as the display zone.

The connection element is advantageously partially covered or shrouded, if appropriate, with any material so as to increase the thickness thereof to a value essentially equal to that of the AMOLED screen.

The connection element is preferably a flexible printed circuit ("fpc"). The connection element is preferably capable of addressing a large number of pixels.

The width of the flexible electrical connection element (notably the connecting part) can be less than or substantially equal to that of the AMOLED screen, typically 50 mm in width for AMOLED widths (horizontal dimension) of at least 100 mm and even more than 150 mm. Large (wide) screens can have several flexible electrical connection elements preferably on one and the same edge of the AMOLED screen.

The distance between the termination of the electrical connection element and the lip of the second glazing is sufficiently large for this termination to be accessible during mounting or dismantling. The total length (unfolded) is adjusted for the connection element to be folded around the second glazing and fixed on face F4. From the exit of the interior glass, a distance of 20 to 150 mm is preferably envisaged.

In one embodiment, the electrical connection element (notably the connecting part) comprises:
- a flexible support preferably polymeric, transparent or otherwise (such as a PET etc) with first front face and first rear face, wires or preferably conducting tracks on the front or rear side,
- optionally electronic components such as transistors,
- the wires or tracks (and electronic components) being covered by an electrically insulating substance, such as a layer of resin or varnish (liquid deposition etc) or a transparent or non-transparent protective film (PET, polyimide etc) for example adhesive-coated.

The connecting part can be linked by any known means to the AMOLED screen: clipping, plug-in. Preferably the connecting part and the AMOLED screen are linked by one or more permanent (solid) links. A link between the connecting part and the AMOLED screen can be made on a technical edge of the AMOLED screen.

Preferably, a polyethylene terephthalate PET, a polyimide, a polyester, a poly(vinyl chloride) PVC, a polycarbonate, polyetheretherketone (PEEK), an acrylate, is chosen as flexible polymeric film, doing so for one at least of the following elements:
- the AMOLED screen (substrate, rear or front protective film: facade film etc),
- the electrical connection element notably the connecting part (substrate, rear or front protective film).

In one embodiment, the laminated glazing comprises a plurality of AMOLED screens, notably at the periphery of a single longitudinal or lateral edge, each with a dedicated interface housing or a common interface housing.

The AMOLED screen can be opaque or transparent. The transparent AMOLED screen (in the clear window region in a peripheral zone or otherwise) is preferably defined by a luminous transmission (LT) of the zone of the laminated glazing comprising it at least equal to 70%.

The less transparent AMOLED screen (intended always to be peripheral) is preferably defined by a luminous transmission (LT) of the zone of the laminated glazing comprising it of less than 20% or even than 10%.

An opaque AMOLED screen can be defined as having a zero LT (for example by addition of a layer or paint—metallic . . . —at the rear of the carrier substrate of the AMOLED system).

In the case of a windshield in particular (notably road vehicle), this AMOLED screen can be arranged peripherally and preferably in the central zone of the upper longitudinal edge in particular in a zone where the width of the external masking layer is of larger width L1 than its width L0 on the driver's and/or copilot's side.

This makes it possible to arrange an AMOLED screen (opaque or slightly transparent) of larger size notably with a larger height H3 (dimension along the vertical). The AMOLED screen can also be more toward the center (edge as close as possible to the boundary).

Preferably, the external masking layer is made of enamel and on face F2 behind the AMOLED screen and the optional other AMOLED screen or screens.

In the off state, the AMOLED screen zone might not be distinguishable from the masking zone further to the rear.

Provision may be made to adapt the color of the external masking layer (enamel notably, on face F2) accordingly.

In one embodiment, the AMOLED screen is transparent and in the clear window region or in that the (transparent or opaque) AMOLED screen is masked by a so-called external masking layer between the rear face of the AMOLED screen and the face F2 (and/or the electrical connection element is masked from the exterior notably by a so-called external masking layer between the rear surface and the face F2 and the technical edge or edges of the AMOLED screen as well as the connection element are masked from the interior by a so-called internal masking layer on face F3 or F4.

In a preferred embodiment, the AMOLED screen covers at most the entire peripheral zone visible by the driver (or copilot if AMOLED screen on the latter's side) in the (automotive) road vehicle windshield up to the edge of the transparent central vision zone and more precisely:
- up to the upper edge of the transparent central vision zone if the AMOLED screen is arranged at the top in a horizontal manner on the drivers side (or copilot's side if AMOLED screen on the latter's side) along the drivers (or passengers) side upper longitudinal edge
- up to the lower edge of the transparent central vision zone if the AMOLED screen is arranged at the bottom in a horizontal manner on the drivers side (or copilot's side if AMOLED screen on the latter's side) along the drivers (or passengers) side lower longitudinal edge
- up to the upper edge of the transparent central vision zone if the AMOLED screen is arranged at the top in a horizontal or vertical manner in the central zone of the upper longitudinal edge
- up to the left edge of the transparent central vision zone (respectively right) if the AMOLED screen is arranged in a vertical manner on the left preferably drivers side (respectively right preferably copilot's side) along the left lateral edge, preferably in the bottom part (lower half of the lateral edge) so as to be wider.

The same holds for said other AMOLED screen or screens—if opaque or slightly transparent preferably masked by the external masking layer, preferably on face F2—.

The upper, lower, lateral (left and right) edges (or limits) of the transparent central vision zone are notably defined by a regulating standard. For example for an automotive road vehicle windshield, this involves the restricted zone B defined according to European standard UN-ECE R43 annex 18, in particular page 133 and § 2.4. The upper limit of the transparent central vision zone is preferably defined on the basis of an angle between the horizontal and 7° from a reference point (the drivers eye, eye at the height Z with respect to the seat of the vehicle with Z=665 mm for a tall driver or Z=589 mm for a short driver.

From the edge concerned of the laminated glazing notably road vehicle windshield, the following distances are defined:
- h1 distance between the upper edge and the upper limit of the peripheral zone of vision of the driver (or of the copilot if AMOLED screen on the latter's side) in the vehicle, preferably of at least 15 mm and even of at least 50 or 90 mm
- h'1 distance between the lower edge and the lower limit of the peripheral zone of vision of the driver (or of the copilot if AMOLED screen on the latter's side) in the vehicle preferably of at least 40 mm and even of at least 100 or 200 mm
- h4 distance between the lateral (left or right) edge and the lateral limit of the peripheral zone of vision of the driver (or of the copilot if AMOLED screen on the latter's side) in the vehicle preferably of at least 15 mm and even of at least 20 or 40 mm.

Away from the zone of the AMOLED screen (and/or of said other AMOLED screens) it is possible to form an external peripheral masking layer (on face F2) like enamel, from the lip up to h1, h'1, h4 while protruding beyond for example the (predetermined) vision zone by at most 2 cm as conventionally.

According to the invention, it is possible to increase in a way the width of the external masking layer so as to mask the AMOLED screen (and said other AMOLED screen or screens) and at the maximum up to the limits of the central transparency zone. The external masking is therefore possible from the limit of the restricted vision zone B up to the edge of the (first) glazing.

As a function of the edge concerned of the laminated glazing notably road vehicle windshield, the following distances are defined:
- h2 distance between the upper edge and the upper limit of the central zone of transparency on the driver's side (or copilot's side if AMOLED screen on the latter's side), preferably of at least 120 mm and even of more than 150 mm or 200 mm or 220 mm,
- h'2 distance between the lower edge and the lower limit of the central transparency zone on the drivers side (or copilot's side if AMOLED screen on the latter's side) preferably of at least 120 mm and even of more than 150 mm or 300 mm,
- $H_a$ distance between the upper edge and the upper limit of the central transparency zone in the central part (for AMOLED screen in central position), preferably of at least 180 mm and even of at least 250 mm or 300 mm,
- h5 distance between the lateral (left or right) edge and the lateral limit of the central zone of transparency on the drivers side (or copilot's side if AMOLED screen on the latter's side) preferably of at least 80 mm and even of more than 120 or 150 mm.

The height h6 of the restricted zone B in the top position (between the potentially opaque zone and the most central zone A) can be from 60 mm to 90 mm. It can serve for a (fairly) transparent AMOLED screen (which may ascend into the potentially opaque zone). Preferably the external masking layer is higher than the AMOLED screen.

The height h'6 of the restricted zone B in the bottom position (between the potentially opaque zone and the central-most zone A) can be between 60 mm and 90 mm. It can serve for a (fairly) transparent AMOLED screen (which may descend into the potentially opaque zone). Preferably the external masking layer is lower than the AMOLED screen.

The external masking layer zone is preferably at least as large as the surface of the AMOLED screen, preferably slightly larger:
- for example by at least 5 mm on each side of the AMOLED screen
- and/or for example by at least 5 mm under the most central edge (bottom edge if position at the top of the AMOLED screen, bottom edge if position at the bottom of the AMOLED screen).

The external masking layer can be a solid zone (flat patch) extended by a discontinuous zone in the form of a network of patterns (geometric patterns, round, square, rectangular shape etc) preferably in gradation in the direction of the center of the laminated glazing (windshield). The gradation can be at most 15 mm and even at most 10 mm and at least 3 or 5 mm in width. The gradation can be in the zone of the lower longitudinal edge of at most 30 mm and even of at most 25 mm and of at least 10 or 15 mm in width. Preferably the AMOLED screen is not behind the gradation but behind the solid zone. At the limit only the gradation can protrude beyond the AMOLED screen.

It is possible with several masking zones widened along a reference edge or distinct edges and even a widened masking zone therefore dedicated for each AMOLED screen.

The laminated glazing notably an (automotive) road vehicle windshield of rectangular shape can be:
- of width (horizontal dimension) Lp of at least 1200 mm and of at most 1850 mm and preferably from 1350 to 1550 mm.
- of height (vertical dimension) Hp of at least 800 mm and of at most 1400 mm and preferably from 950 to 1050 mm.

Preferably the AMOLED screen (in an automotive road vehicle windshield) is at least 80 mm by 120 mm.

Preferably the height H3 (and W3) of the AMOLED screen in an automotive road vehicle windshield is adjusted as a function of the standard in force.

Preferably the width W3 of the AMOLED screen in an automotive road vehicle windshield arranged horizontally in the top position (upper edge) is at least 100 mm and better at least 120 mm and even greater than 200 mm, than 350 mm, and even greater than or equal to 500 mm, notably or over the entire drivers side zone between a first visible lateral edge and the top central zone (and even all or part of the top central zone included) or the entire copilot's side zone between the second visible lateral edge and the top central zone (and even all or part of the top central zone included).

Preferably the height H3 of the AMOLED screen in an automotive road vehicle windshield arranged horizontally in the top position (upper edge) is at least 80 mm and better at least 100 mm.

Preferably the width W3 of the AMOLED screen in an automotive road vehicle windshield arranged horizontally in the bottom position (lower edge) is at least 100 mm and better at least 120 mm and even greater than 200 mm, than 350 mm and even greater than or equal to 500 mm, notably or over the entire drivers side zone between the visible lateral edge and a middle zone (and even all or part of the bottom central zone included) or the entire copilot's side zone between the second visible lateral edge and the bottom central zone (and even all or part of the bottom central zone included). Preferably the height H3 of the AMOLED screen in an automotive road vehicle windshield arranged horizontally in the bottom position (lower edge) is at least 80 mm and better at least 100 mm.

Preferably the width W3 of the AMOLED screen in an automotive road vehicle windshield arranged vertically in the top position (upper edge) in the central zone is at least 100 mm and better from at least 120 mm to 280 mm or even 300 mm.

Preferably the height H3 of the AMOLED screen in an automotive road vehicle windshield arranged vertically in the top position (upper edge) in the central zone is at least 80 mm and better at least 100 mm and even from at least 150 mm and up to 200 mm.

The second glazing preferably comprises a local notch. The connection element exits the lip of the second glazing via the notch of width preferably at least the width of the connection element and preferably at most the width of the AMOLED screen (not including the radii of the fitting).

The dimensions of the notch are therefore adapted:
width of the notch greater than or equal to that of the connection element;
depth of the notch greater than or equal to the thickness of the connection element so as to avoid it being visible from the outside in a case when the edge is evident.

In practice the depth of the notch is preferably from 1.5 mm to 3 or even to 2 mm. The notch zone is preferably (substantially) devoid of lamination interlayer.

The lamination interlayer of polymeric substance is chosen from among polyvinylbutyral, ethylene—vinyl acetate, ionomer polyurethane or resin, alone or in mixtures of several varieties of one of them and/or of several of them; the term "varieties" refers here to variations of the amount of plasticizer, of branchings/linearity, average molecular weight of the molecules . . .

To ensure good water-tightness, it surrounds and is in contact with the AMOLED screen (rim and front and rear face) indeed even of the electrical connection element of flat connector type.

The lamination interlayer can itself be made of polyvinylbutyral (PVB), polyurethane (PU), ethylene/vinyl acetate copolymer (EVA), formed from one or more films, having for example a thickness of between 0.2 mm and 1.1 mm.

The surface of the lamination interlayer can be smaller than the surface of the laminated glazing, for example leaving a groove (frame-like or banner-like), which is free and therefore unlaminated.

The first glazing like the second glazing may be parallelepipedal, with rectangular, square main faces or sheets or even of any other shape (round, oval, polygonal).

The first and/or second glazing can (according to the esthetic result, the desired optical effect) be a clear glass (of luminous transmission LT greater than or equal to 90% for a thickness of 4 mm), for example a soda-lime standard composition glass such as Planilux® from the company Saint-Gobain Glass, or extra-clear glass (LT greater than or equal to 91.5% for a thickness of 4 mm), for example a soda-lime-silica glass with less than 0.05% of Fe III or of $Fe_2O_3$ such as Diamant® glass from Saint-Gobain Glass, or Optiwhite® glass from Pilkington, or B270® from Schott, or another composition described in document WO04/025334.

The glass of the first and/or second glazing can be neutral (no coloration), or (slightly) tinted notably gray or green, such as the TSA glass from the company Saint-Gobain Glass. The glass of the first and/or second glazing can have undergone a chemical or thermal treatment of the hardening, annealing type or a tempering (for better mechanical strength notably) or be semi-tempered.

The luminous transmission LT can be measured according to ISO standard 9050:2003 using the illuminant D65, and is the total transmission (notably integrated in the visible region and weighted by the sensitivity curve of the human eye), taking account both of direct transmission and of possible diffuse transmission, the measurement being made for example with the aid of a spectrophotometer furnished with an integrating sphere, the measurement at a given thickness thereafter being converted if appropriate to the reference thickness of 4 mm according to ISO standard 9050:2003.

For a laminated vehicle glazing notably windshield or lateral glazing, the LT can preferably be at least 70% and even at least 75% or 80%.

In one embodiment the first glazing is made of mineral glass and the second glazing is made of organic glass (such as PC, PMMA, cyclo-olefin copolymer (COC) or else polyethylene terephthalate (PET) optionally protected by a coating (on face F4).

The exterior glazing can comprise functional thin layers on one or the other of its faces F1 and F2 or else both: it is possible to cite a photocatalytic self-cleaning or hydrophobic layer on face F1.

Preferably the laminated glazing forms a windshield of a road vehicle such as an automobile, a truck, with the first and second glazing cambered and even a PVB lamination interlayer. The camber of the first and second glazings (windshield) can be in one or more directions for example as described in document WO2010136702.

The AMOLED screen can preferably have a thickness of at most 0.8 mm, preferably at most equal to 0.7 mm, and in a particularly preferred manner at most equal to 0.6 mm and even of at least 0.15 mm.

The AMOLED screen preferably comprises a flexible support (polymeric, glass or indeed a metal) bearing a so-called lower electrode (often the anode) of an organic light-emitting system and an upper electrode, while including a matrix of thin-film transistors (TFT). Other functional elements or layers are possible notably:
between the support and the lower electrode and in the form of a deposition or film: barrier layer (against oxygen, moisture etc),
on the upper electrode and in the form of a deposition or film: protective layer (against oxygen, moisture etc), for example a deposition (varnish, shrouding, resin etc) and/or facade film (transparent polymeric film: PET etc).

More precisely the pixel preferably comprises side by side two or three of the following systems:
an organic light-emitting system emitting in the red termed "R",
an organic light-emitting system emitting in the green termed "G",
an organic light-emitting system emitting in the blue termed "B",
an organic light-emitting system emitting in the white termed "W";
in particular RGB,RWB,WBG,RWB,W,BG.

The number of pixels is at least 64×128. The emission is of top emitting type (emission away from the substrate). Front face is intended to mean the viewing face.

Provision may be made for means for modulating the power of the AMOLED screen according to at least two configurations: a configuration for nighttime vision, in which the power of the AMOLED screen is adjusted so that the luminance typically lies between about 10 and about 400 $Cd/m^2$ and a configuration for daytime vision, in which the power of the AMOLED screen is adjusted so that the luminance typically lies between about 10 and about 500 $Cd/m^2$. In daytime vision, it is also possible to adjust the luminance of the AMOLED screen as a function of the exterior illumination.

All information can be displayed on the AMOLED screen (notably on a windshield): exterior and interior atmospheric conditions, vision of the rear environment, vision of the left and right lateral environment (as already indicated), information related to the driving conditions and signposts, technical information relating to the transport vehicle.

The AMOLED screen in particular can have one or more of the following functions (which can be aggregated):
central vison of the rear,
display of driving aid information, in particular alerts, detection of obstacles, display of information (levels, operating state, state of wear, etc) on the characteristics of the vehicle (engine, wheels, brakes, headlights etc), in particular in case of alert (with a requested stop), display of information on the exterior environment: weather, distance to a service station (to an electricity point etc), to a town, to a highway exit, display of information on connectivity: access to the network (social network, Internet etc), operation in telephone mode: display of the speaker, of a person (police, medical setting) in case of emergency and/or of accident or of a risk situation.

The AMOLED screen and/or another AMOLED screen can also act as copilot side TV, or as operation in telephone mode: display of the speaker, of a person (police, medical setting) in case of emergency and/or of accident or of a risk situation.

The AMOLED screen can display several images as in a television main image (central vision of the rear etc)

inlaid image(s) (lateral vision of the vehicle etc).

The AMOLED screen is notably rectangular or square.

On the front face side, at least one peripheral band termed the technical edge of the AMOLED screen (distinct zone from the active zone, for display) can be masked by a so-called internal masking layer, preferably of enamel, on the face F3 or F4 or by a masking element (opaque layer, film) on the front face. And/or the front surface of the connection element (the connecting part) can be masked by a (same) so-called internal masking layer, preferably of enamel, on the face F3 or F4 or by a masking element (opaque film) on the front surface.

The internal masking layer is optionally a flat patch with an opening revealing the display zone and of width less than or equal to the width of the external masking layer.

The internal masking layer can form not only:

a masking of the connecting part, opaque or slightly transparent, as well as a masking of the technical edges of the AMOLED screen, seen from the interior side of the glazing, notably of the windshield, and even, by protruding beyond the technical edge or edges, of the junction between the lamination interlayer and the AMOLED screen, which junction may comprise irregularities and flaws, (and even of the junction between the lamination interlayer and the connecting part).

The masking element can form part of a support film and/or protection such as polyethylene terephthalate (PET) of the AMOLED screen and of the connecting part.

The opaque film can be stuck to the whole of the AMOLED screen and of the connecting part immediately when premounted with a view to its storage, or else form part of a film which has been stuck to this premounted assembly, from which film can then optionally be removed an undesired part precut before assembling the windshield.

The masking element (opaque film etc) can form not only:

a masking of the connecting part, opaque or slightly transparent, as well as a masking of the technical edges of the AMOLED screen, seen from the interior side of the windshield, and even, by protruding beyond the technical edge or edges, of the junction between the lamination interlayer and the AMOLED screen, which junction may comprise irregularities and flaws, (and even of the junction between the lamination interlayer and the connecting part).

The opaque film can also be an opacified extension of the transparent polymer material covering the AMOLED screen, that is to say be an integral part thereof.

The opaque film can also alternatively or cumulatively be an extension of the polymer material covering the connecting part, that is to say be an integral part thereof.

The internal masking layer or the masking element (the opaque film) can protrude beyond the technical edges by at least 0.1 mm and even by at most 5 mm or 2 mm.

The two embodiments with internal masking layer/masking element are not necessarily mutually exclusive, and it is possible to contemplate a masking of the technical edge of the AMOLED screen according to the first embodiment and a masking of the connection element (the connecting part) according to the second, or a double masking of the technical edge of the AMOLED screen or of the connection element according to both embodiments at the same time.

The function of the masking is to hide non-useful and unsightly parts of the device so that only the useful part thereof remains visible from the interior; any method suited to the nature of the substrate according to the first or second embodiment can be employed: printing such as ink jet, silk-screen, enamel as on the face F2 . . .

The internal masking layer can confine itself to masking the technical edge or edges and a part (at least the visible part) of the electrical connection element (of the connecting part), or even protrude optionally a little by at most 1 to 2 cm. The internal masking layer can be in the zone with the AMOLED screen of width less than or equal to that of the external masking so that the external masking is visible by transparency on either side of the AMOLED screen.

An internal and/or external masking layer can be a dark (black) enamel layer, but more broadly a layer of opaque paint or ink, or a painted polymer layer (e.g. printed PVB), for example polyethylene, polymethyl methacrylate (PMMA).

The external masking layer on face F2 and the internal one on F3 or F4 preferably consist of the same material and even enamel. It is preferred to have an enamel layer at least on face F2 and even on face F4.

The present invention will be better understood and other details and advantageous characteristics of the invention will be apparent on reading the examples of laminated vehicle glazings according to the invention and illustrated by the following figures:

FIGS. 1, 1', and 1a, are each a face-on schematic view of a windshield with AMOLED screen of an automotive vehicle, inside view FIGS. 1*bis*, 1'*bis* are face-on and detail schematic views of a windshield with AMOLED screen of an automotive vehicle, inside view FIGS. 2, 3, 4, 5, 6, 7 are sectional and partial schematic views of a windshield with AMOLED screen of an automotive vehicle, inside view.

It is specified that out of concern for clarity the various elements of the objects represented are not necessarily reproduced to scale. For simplicity, the glazings are not represented cambered nor are the flexible elements in the lamination represented curved while adapting to this or these curvatures (in two dimensions) of glazing.

FIG. 1 is a partial schematic representation viewed from the interior of a windshield with AMOLED screen 100 of an automotive vehicle.

The windshield 100 comprises a clear view central zone (central part of the interior glazing therefore face F4 side 14) and an external masking peripheral frame 5, bottom 15a and top 15b, left lateral 15c and right lateral 15d longitudinal edges, frame here masking the rear of the opaque or slightly transparent AMOLED screen 3 (not transparent enough to be in the clear window region). The external masking layer 5, on face F2, thus hides from a view of the exterior of the vehicle the AMOLED screen 3 (and its connector not represented here, preferably in the laminate). The function of the enamel 5 is first to hide, viewed from the face F1, the glue bead fastening the final laminated glazing to the bodywork bay.

The AMOLED screen is arranged in a central position of the top longitudinal edge 15b in a horizontal manner and is rectangular. It is (all or part) in a so-called widened zone the width (vertical dimension) L1 of whose enamel is larger than the adjacent width L0 (for example on the left) serving for the conventional and even copilot side masking. For example, the horizontal dimension or width W3 is at least 120 mm and even up to 250 mm. The vertical dimension or height H3 is at least 75 mm.

Here the AMOLED screen 3 is down at the bottom-most of the widened peripheral zone. Its bottom edge 34 is in proximity to or on the boundary of the enamel flat patch 51 (solid zone) rather than on the boundary of the optional zone with enamel patterns for example at most 15 mm in width. Its top edge 34' can be as high as possible (to the limit of the zone of vision in the cabin), typically at least 15 mm and better at least 70 mm. This depends on the design of the windshield (size, inclination, clear view desired by the maker).

The edges 53, 53' of the widened enamel zone 50 can protrude beyond the lateral edges 33 and 33' for example by at most 2 cm or even 1 or 0.5 cm (limit of the solid zone). In the off state, the AMOLED screen is dark and is even barely if at all distinguishable from the enamel background 5 (protruding over the sides). It is possible to adapt the enamel color accordingly. Preferably the enamel is opaque and dark.

The AMOLED screen is here in a distinct peripheral zone from the transparent central zone termed zone A $Z_A$ (the most central and in two parts, quadrilateral-like) or of the restricted zone B $Z_b$ (dashed).

On the lit AMOLED screen 3, it is possible to see the central vision of the rear of the vehicle and preferably the lateral visions of the vehicle.

The AMOLED screen can have the rear vision function. It can also have other functions such as: telephone mode, television mode, display of environmental data or data on the road (maps, GPS etc) or on the vehicle, simultaneous display on one or more screen zones (for example in the manner of a mobile telephone screen).

In a variant, not shown, the AMOLED screen is on the drivers side top longitudinal edge. It is higher but can be wider than in the central zone and protrude into the central zone (away from projecting enamel zone).

As a variant, not shown, the AMOLED screen is on the drivers side bottom longitudinal edge in the vision zone. It can be wider than in the central zone.

As a variant, not shown, the AMOLED screen is on the drivers side bottom lateral edge and is arranged vertically as low down as possible in the vision zone.

The interface housing (peripheral) is not represented.

FIG. 1' is a partial schematic representation viewed from the interior of a windshield 100' with AMOLED screen of an automotive vehicle.

The windshield 100' differs from that in FIG. 1 in that the AMOLED screen is arranged in a vertical manner (H3 larger and W3 smaller). For example H3 is 150 mm to 300 mm and W3 is 60 mm to 120 mm.

The interface housing (peripheral) is not represented.

As a variant, not shown, two AMOLED screens are disposed in this central zone on either side of the AMOLED screen:
for example also arranged in a vertical manner
for example arranged in a horizontal manner FIG. 1a is a partial schematic representation viewed from the interior of a windshield 100a with AMOLED screen of an automotive vehicle.

The windshield 100a differs from that in FIG. 1 in that the AMOLED screen is arranged in a transparent zone (required) for example with the top edge 34' at the limit of the solid zone 51. The interface housing (peripheral) is not represented.

FIG. 1bis is a face-on and detail schematic view of a windshield 100bis with AMOLED screen of an automotive vehicle, inside view.

For simplicity the exterior masking layer is not represented although it covers the zone of the AMOLED screen (which is peripheral, opaque or slightly transparent). The solid-line elements are seen by transparency through the interior glazing 1'.

As in FIG. 1, the AMOLED screen 3 is arranged horizontally in the central zone of the top longitudinal edge 15b. The windshield 100bis comprises an exterior mineral glass sheet 1 and an interior mineral glass sheet 1' whose upper edge 15b exhibits a notch 11'.

The AMOLED screen 3 is sandwiched between the exterior glass sheet 1 and the interior glass sheet 1'. It exhibits a display zone 32' flanked by one or more technical edges (here four) in narrow lateral peripheral 33 and 33', bottom 34, top 34' bands generally at least 0.5 mm in width. It is supplied through an electrical connection element 4 of the AMOLED screen 3 which comprises:

a flexible so-called connecting part 40 between the face F2 and the face F3 within the lamination interlayer with a front surface on the face F3 side and a rear surface on the face F2 side, of thickness E4 less than that E2 of the lamination interlayer, linked to the AMOLED screen and extending the AMOLED screen in the direction of the lip of the second glazing, extended outside of the lip of the second glazing by a flexible so-called exterior part 45, curved and fixed by gluing on face F4 without stretching as far as the display zone 32' via a so-called terminal part 47 terminated by its connector 8 in a zone accessible at the time of mounting/dismantling.

The connection element 4 is a flexible printed circuit (FPC) suitable for the implementation of 2560×1600 pixels (AMOLED screen). The FPC 4 could also advantageously be of the same width as the AMOLED screen 3, so as to facilitate the insertion of the two elements into the lamination interlayer preferably of polyvinylbutyral (PVB set back a little with respect to the glazing edges). The interior glass 1' comprises a notch 11'. The dimensions of the notch 11' are suited to the FPC 4:

width of the notch 11' greater than or equal to that of the FPC 4;

depth of the notch 11' greater than or equal to the thickness of the FPC 4 preferably so as to prevent the FPC 4 being visible from the exterior in a case when the edge is evident.

In practice the depth of the notch 11' lies between 1.5 mm and 2 mm. The zone of the notch 11' is substantially devoid of lamination interlayer.

The interface housing 70, for example parallelepipedal, is connected to the connector 8 here on a lateral edge and on another edge (here longitudinal) to a connector 71 of a power supply cable 72. d is for example a few cm.

FIG. 1'*bis* is a face-on and detail schematic view of a windshield 100'*bis* with AMOLED screen of an automotive vehicle, inside view. For simplicity the exterior masking layer is not represented although it covers the zone of the AMOLED screen (peripherally, opaque or slightly transparent). The solid-line elements are seen by transparency through the interior glazing 1'.

It differs from the windshield 100*bis* by its arrangement vertically.

The interface housing 70, for example parallelepipedal, is mounted on the terminal part 47 and connected on an edge (here lateral) to a connector 71 of a power supply cable 72. d is for example a few cm.

FIG. 2 is a sectional and partial schematic view of a windshield 200 with AMOLED screen of an automotive vehicle, inside view.

The windshield 200 comprises:
- a first glazing 1, with a first main face 11 termed F1, intended to be on the outside of the vehicle, and a second opposite main face 12 termed F2, preferably of thickness E1 of at most 2.5 mm, in particular a preferably tinted soda-lime-silica float glass sheet, with a 2.1 mm thickness of glass such as a TSA glass from the Applicant company
- a lamination interlayer of polymeric substance 2, on the face F2 side, of thickness E2 preferably of at least 0.76 mm such as polyvinylbutyral (PVB)
- a second glazing 1', with a third main face 13 termed F3 on the lamination interlayer 2 side and a fourth opposite main face 14 termed F4, intended to be on the inside of the vehicle, preferably of thickness E1 of at most 2.2 mm, in particular a soda-lime-silica float glass sheet with a 1.6 mm thickness of glass, for example tinted such as a TSA glass from the Applicant company,
- between the face F2 and the face F3 and within the lamination interlayer, an organic light-emitting diode-based viewing screen, comprising a set of pixels, termed a flexible AMOLED screen 3, the AMOLED screen comprising a zone of dynamic information display 32', of thickness E3 less than E2 and preferably subcentimetric, AMOLED screen having a front main face 32 oriented toward the face F3 and a rear face 31 oriented toward the face F2, the AMOLED screen is arranged peripherally,
- within the lamination interlayer an electrical connection element 4 of the AMOLED screen.

The OLED screen 3 is therefore sandwiched between the exterior glass sheet 1 and the interior glass sheet 1'. It exhibits a display zone 32' flanked by one or more technical edges (one, two, three or four) in narrow peripheral bands 34, 34' generally at least 0.5 mm in width (and less than 1 cm preferably). The AMOLED screen 3, flexible and extended directly toward an edge of the glazing, by the connection element 4 which is linked to it and extends outside the lamination.

It is supplied through an electrical connection element 4 of the AMOLED screen 3 which comprises:
- a flexible so-called connecting part 40 between the face F2 and the face F3 within the lamination interlayer with a front surface 42 on the face F3 side and a rear surface 41 on the face F2 side, of thickness E4 less than that E2 of the lamination interlayer linked to the AMOLED screen and extending the AMOLED screen in the direction of the lip of the second glazing 1',
- extended outside of the lip of the second glazing via a so-called exterior part 45 and curved and fixed by gluing (on face F4 without stretching as far as the display zone 32' via a terminal part 47 terminated by its connector 8 in a zone accessible at the time of mounting/dismantling.

The connection element 4 is a flexible printed circuit (FPC) suitable for the implementation of 2560×1600 pixels (AMOLED screen). The FPC 4 could advantageously be of the same width as the AMOLED screen 3, so as to facilitate the insertion of the two elements into the lamination interlayer (set back a little with respect to the glazing edges).

The interior glass 1' comprises a notch 11'. The dimensions of the notch 11' are suited to the FPC 4:
- width of the notch 11' greater than or equal to that of the FPC 4;
- depth of the notch 11' greater than or equal to the thickness of the FPC 4 preferably so as to prevent the FPC 4 being visible from the exterior in a case when the edge is evident.

In practice the depth of the notch 11' lies between 1.5 mm and 2 mm. The zone of the notch 11' is substantially devoid of lamination interlayer.

The interface housing 70 glued by adhesive 7*a* (pressure-sensitive etc.) on the face F4 14 is for example parallelepipedal is connected to the connector 8 here on a longitudinal edge and on another edge (here lateral) to a connector 71 of a power supply cable (not shown). d is for example a few cm.

The AMOLED screen 3 has for example a thickness E3. The connecting part 40 can be less thick. It is optionally covered or shrouded with any material so as to increase (if necessary) the thickness E4 thereof to a value substantially equal to E3. If E4 is equal of 0.4 mm, E3 is from 0.38 to 0.40 mm. A central ply 22 of 0.38 mm is for example used for the lamination, with a reserve to house the AMOLED screen and the connecting part and two external plies 22, 23 of 0.17 mm or 0.38 mm. One of the external plies can be thicker for example 0.76 mm.

It is possible to have more than 3 plies (if insertion of a polymeric film such as a PET etc) or for more mechanical protection.

When the AMOLED screen is at most 0.15 mm or even 0.2 mm in thickness, it is optionally possible to eliminate the central ply during assembly.

The first glazing (exterior) 1 comprises an external masking layer 5 on face F2, opaque, of black enamel preferably,
- with an edge 51 toward the center of the windshield
- and an edge 52 on the lip side of the glazing 15 for example at a distance of at most 3 or 1 mm from the lip 15.

It hides not only the glue bead 7' of the trim 7" but also the AMOLED screen 3 (opaque or slightly transparent), the connecting part 40 and the off-glazing part 45 of the FPC and the part 47 and its connector 8.

The external masking layer 5 is preferably a solid zone (a flat patch) rather than a network of patterns. Beyond the edge 51 it can be extended by a network of patterns (made of the same substance) for example in gradation over a width of at most 15 mm and even 5 mm and even larger if the lip 15 is the lower longitudinal edge.

The second glazing 1' (interior) comprises on face F4 an internal masking layer 6 on face F4 (or as a variant F3), opaque, of black enamel preferably, with
- an edge 61 toward the center of the windshield
- an edge 65 on the notch side.

This internal masking layer 6 masks from the interior the entire surface of the connecting part 40 in particular that which is in the vision zone (away from zone with trim or optional casing). It can be wider than the connecting part.

This internal masking layer also masks from the interior the technical edges 34, 34' of the AMOLED screen. It can protrude for example by at most 10 mm opposite the lamination interlayer over the perimeter of the technical edges in order to mask lamination defects.

When the internal masking layer 6 is thus on the perimeter of the AMOLED screen 3, an opening 63 has therefore been formed (masking or post fabrication of the layer) revealing the display zone 32'.

It can also protrude further beyond the technical edges so that its width is (almost equal) to that of the external masking layer 5 on either side of the AMOLED screen (and/or of the connecting part).

The internal masking layer 6 is preferably a solid zone (a flat patch) rather than a network of patterns. Beyond the edge 61 it can be extended by a network of patterns (made of the same substance) for example in gradation over a width of at most 15 mm and even 5 mm and even larger if the lip of the notch 11' is the lower longitudinal edge.

FIG. 3 is a sectional and partial schematic view of a windshield 300 with AMOLED screen of an automotive vehicle, inside view.

The windshield 300 differs from the windshield 200 firstly in that the internal masking layer is on face F3 instead of face F4.

The interface housing 70, for example parallelepipedal, is mounted by gluing 7a (adhesive, pressure-sensitive etc.) on the terminal part 47 and connected to an edge (here lateral) to a connector 71 of a power supply cable (not shown). d is for example a few cm.

The width of the adhesive 7 can be increased.

FIG. 4 is a sectional and partial schematic view of a windshield 400 with AMOLED screen of an automotive vehicle, inside view.

It differs from the windshield 200 in that the internal masking layer 6 is replaced with an opaque (opacified) film 6' of polyethylene terephthalate (PET) that can be stuck to the whole of the AMOLED screen 3 and of the FPC 4 immediately when premounted with a view to its storage, or else form part of a film which has been stuck to this premounted assembly, from which film can then optionally be removed an undesired part precut before assembling the windshield.

The opaque film 6' constitutes:
- a masking of the FPC 40, opaque or slightly transparent, and of the junction between the PVB 22 (central part) and the AMOLED screen 3, which can comprise irregularities and flaws,
- as well as a masking 61', 62' of the technical edges 34 of the AMOLED screen 3, seen from the interior side of the windshield.

The opaque film 6' can also be an opacified extension of the transparent polymer material covering the AMOLED screen, that is to say be an integral part thereof.

The opaque film 6' can also alternatively or cumulatively be an extension of the polymer material covering the FPC, that is to say be an integral part thereof.

Moreover, the face F3 is furnished with an electroconducting layer 9 and optionally with a current infeed 9' for the latter; this layer can consist of a stack which reflects solar radiation, in silver or other, or with a heating coating/stack furnished for this purpose with its current infeed 9'. It can be covered directly with a masking of the technical edge of the AMOLED screen mentioned previously.

FIG. 5 is a sectional and partial schematic view of a windshield 500 with AMOLED screen of an automotive vehicle, inside view.

It differs from the previous windshield 400 in that for esthetic reasons the electroconducting layer is absent at least in the zone 91 opposite the display zone 32'.

FIG. 6 is a sectional and partial schematic view of a windshield 600 with AMOLED screen of an automotive vehicle, inside view.

It differs from the windshield 200 in that the AMOLED screen 3 is placed in a transparent vision zone of which without external masking layer 6 behind.

However the masking of the exterior of the technical edges 34, 34' (and even of the PVB 22) by the external enamel layer 5,51 can be accepted. Hence the enamel layer 5 can have an opening 53 facing the AMOLED screen zone. And the masking of the interior of the technical edges 34, 34' (and even of the PVB 22) by the internal enamel layer 6,61 can be accepted. Hence the enamel layer 6 can have an opening 63 facing the AMOLED screen zone.

FIG. 7 is a sectional and partial schematic view of a windshield 700 with AMOLED screen of an automotive vehicle, inside view.

It differs from the windshield 600 by the replacement of the internal masking layer 6 by an opaque film 6' (as in FIG. 5) on the AMOLED screen and the FPC 40 on the front side. It is also possible to use an opaque film 6" (as in FIG. 5) on the AMOLED screen and the FPC 40 on the rear side in addition to or as replacement for the enamel of the edge 51.

The invention claimed is:

1. A laminated vehicle glazing, comprising:
    a first glazing, with a first main face, to be oriented on the outside of the vehicle, and a second opposite main face, the first glazing of thickness E1;
    a lamination interlayer of polymeric substance, on the second main face side, the lamination interlayer of thickness E2;
    a second glazing, with a third main face on the lamination interlayer side and a fourth opposite main face, to be oriented on the inside of the vehicle, the second glazing of thickness E'1, at least one of the first and second glazings being made of mineral glass,
    between the second main face and the third main face, an organic light-emitting diode-based viewing screen, comprising a set of pixels, the organic light-emitting diode-based viewing screen comprising a zone of dynamic information display, the organic light-emitting diode-based viewing is of thickness E3 less than E2, the organic light-emitting diode-based viewing screen having a front main face oriented toward the third main face and a rear face oriented toward the second main face, the organic light-emitting diode-based viewing screen being covered by a non-zero thickness of lamination interlayer,
    an electrical connection element of the organic light-emitting diode-based viewing screen, with a flexible connecting part between the second main face and the third main face with a front surface on the third main face side and a rear surface on the second main face side, the flexible connecting part covered by a non-zero thickness of lamination interlayer, the electrical connection element being of thickness E4 less than E2, linked to the organic light-emitting diode-based viewing screen and extending the organic light-emitting diode-based viewing screen in the direction of the lip of the second glazing, the electrical connection element then extending outside of the lip of the second glazing via an exterior part, wherein the organic light-emitting diode-based viewing screen is flexible and the electrical connection element comprises a terminal part which is against on the fourth main face, and wherein the glazing comprises, on the fourth main face, an interface housing connected to the terminal part of the electrical connection element and enclosing one or more electronic components, the interface housing furthermore being connected with a wired power supply system on one and the same edge or on a distinct edge of the interface housing.

2. The laminated vehicle glazing as claimed in claim 1, wherein the electrical connection element is flexible and comprises a flexible connecting part between the second main face and the third main face with a front surface on the third main face side and a rear surface on the second main face side, the electrical connection element being of thickness E4 less than E2, linked to the organic light-emitting diode-based viewing screen and extending the organic light-emitting diode-based viewing screen in the direction of the lip of the second glazing, the electrical connection element extending outside of the lip of the second glazing by an exterior part which is curved.

3. The laminated vehicle glazing as claimed in claim 1, wherein the interface housing is connected to a wired data signals transport system for the wherein screen, the wired system being on one and the same edge of the interface housing or on a distinct edge as for the wired power supply system.

4. The laminated vehicle glazing as claimed in claim 1, wherein the interface housing contains a receiver of data arising from a local wireless communication network transporting data for the organic light-emitting diode-based viewing screen.

5. The laminated vehicle glazing as claimed in claim 1, wherein the interface housing is mounted on the terminal part or is adjacent to the terminal part and connected to an end of the terminal part and against or fixed to said fourth main face.

6. The laminated vehicle glazing as claimed in claim 1, wherein the interface housing is made of plastic.

7. The laminated vehicle glazing as claimed in claim 1, wherein the connecting part is of submicronic thickness E4 and the terminal part is of thickness E'4 less than E4.

8. The laminated vehicle glazing as claimed in claim 1, wherein the organic light-emitting diode-based viewing screen is transparent and in a clear window region or wherein the organic light-emitting diode-based viewing screen is masked by an external masking layer between the rear face of the organic light-emitting diode-based viewing screen and the second main face, and/or the electrical connection element is masked from the exterior by an external masking layer between the rear surface and the second main face.

9. The laminated vehicle glazing as claimed in claim 1, wherein the second glazing bears on the third main face or the fourth main face an internal masking layer configured to mask from the interior:

the technical edge or edges of the organic light-emitting diode-based viewing screen and optional other organic light-emitting diode-based viewing screen(s) that is or are adjacent or on distinct longitudinal edges and to mask even a junction zone between the lamination interlayer and the organic light-emitting diode-based viewing screen or optional other organic light-emitting diode-based viewing screen(s), and/or the electrical connection element or elements of the organic light-emitting diode-based viewing screen and optional other organic light-emitting diode-based viewing screen(s) that is or are adjacent or on distinct longitudinal edges.

10. The laminated vehicle glazing as claimed in claim 1, wherein technical edge or edges of the organic light-emitting diode-based viewing screen and of optional other organic light-emitting diode-based viewing screen(s) are masked by an interior masking element on the organic light-emitting diode-based viewing screen, and/or the electrical connection element or elements are masked by said interior masking element or another adjacent one.

11. The laminated vehicle glazing as claimed in claim 1, wherein the organic light-emitting diode-based viewing screen and/or the connecting part has a thickness at most equal to 0.8 mm.

12. The laminated vehicle glazing as claimed in claim 1, wherein the laminated vehicle glazing forms a windshield of a road vehicle, with the first and second glazing cambered.

\* \* \* \* \*